(12) United States Patent
Zhuang et al.

(10) Patent No.: US 6,576,293 B2
(45) Date of Patent: Jun. 10, 2003

(54) METHOD TO IMPROVE COPPER THIN FILM ADHESION TO METAL NITRIDE SUBSTRATES BY THE ADDITION OF WATER

(75) Inventors: Wei-Wei Zhuang, Vancouver, WA (US); Sheng Teng Hsu, Camas, WA (US); David R. Evans, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/817,836

(22) Filed: Mar. 26, 2001

(65) Prior Publication Data

US 2002/0176938 A1 Nov. 28, 2002

(51) Int. Cl.$^7$ ............................................... C23C 16/18
(52) U.S. Cl. .................. 427/252; 427/255.28; 438/680; 438/681; 438/687
(58) Field of Search ............................ 427/252, 255.28; 438/680, 681, 687

(56) References Cited

U.S. PATENT DOCUMENTS 6,355,562 B1 * 3/2002 Charneski et al. .......... 438/622

FOREIGN PATENT DOCUMENTS

EP          989203      * 3/2000

OTHER PUBLICATIONS

Article by Gelatos et al., entitled "Chemical Vapor Deposition of Copper from Cu+1 Precursors in the presence of Water Vapor", published in Appl. Phys. Lett. 63(20), 1993, pp. 2842–2844.

Article by Norman, et al., entitled "Chemical Additives For Improved Copper CVD Processing", published in Thin Solid Films 262 (1995) pp. 46–51, 1994.

Article by Jain et al., entitled "Chemical Vapor Deposition of Copper from (hfac)CuL(L=tmvs and 2–butyne) in the Presence of Water, Methanol and Dimethyl Ether", published in Chem. Mater., 8, pp. 1119–1127, 1996.

Paper presented at the University of California, Berkeley, Continuing Education in Engineering, at the Advanced Metalization for ULSI Application Conference, Oct. 4–6, 1994, Austin, Texas entitled "Chemical Additives for Improved Copper CVD Processing", by Norman et al.

* cited by examiner

Primary Examiner—Timothy Meeks
(74) Attorney, Agent, or Firm—David C. Ripma; Matthew D. Rabdau; Scott C. Krieger

(57) ABSTRACT

A method of forming a copper thin film by chemical vapor deposition, includes introducing a wafer into a chemical vapor deposition chamber; humidifying helium gas with water to form a wet helium gas for use as the atmosphere in the chemical vapor deposition chamber; depositing a copper seed layer at a wet helium flow rate of between about 5.0 sccm and 20.0 sccm during a wafer temperature rise from ambient temperature to between about 150° C. to 230° C.; and depositing a copper thin film layer at a wet helium flow rate of between about 0.2 sccm to 1.0 sccm and at a temperature of between about 150° C. to 230° C.

13 Claims, 4 Drawing Sheets

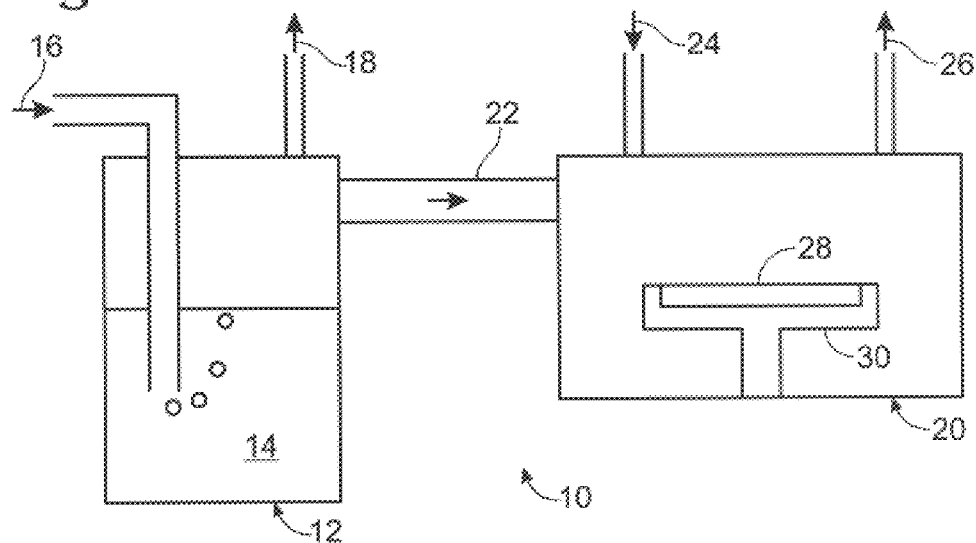
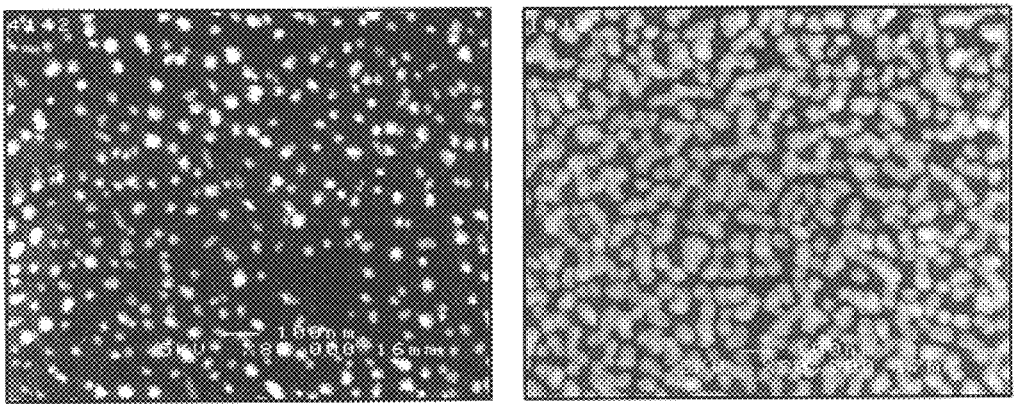

METHOD TO IMPROVE COPPER THIN FILM ADHESION TO METAL NITRIDE SUBSTRATES BY THE ADDITION OF WATER

FIELD OF THE INVENTION

This invention relates to the chemical vapor deposition (CVD) of copper thin films, and specifically to a method of adding water during the CVD process in improve the adhesive properties of the copper thin film on metal nitride substrates.

BACKGROUND OF THE INVENTION

The use of water in CVD of copper is known from Gelatos, et al., "*Chemical vapor deposition of copper from Cu+1 precursors in the presence of water vapor*", Appl. Phys. Lett. 63(20), 1993, pp. 2842–2844, wherein a method of adding water vapor to Cu(hfac)(tmvs), where hfac=hexafluoroacetylaceton and tmvs=trimethylvinylsilane, improves the deposition rate of copper and decrease the resistivity of the deposited copper thin films. Hochberg, et al., disclose a method of adding water to a Cu(hfac)(tmvs) precursor in the form of hexafluoroacetylacetone (hfac) dihydrate (H(hfac)(2H$_2$O), in "*Chemical Additives For Improved Copper CVD Processing Using (hfac)Cu(tmvs)*", Advanced Metallization for ULSI Applications, 1994, wherein the stability of the precursor is improved and the deposition rate of copper thin films are increased, however, the conductivity of the copper thin films is not improved, and the formed copper thin films have a rough texture.

Jain, et al., "*Chemical Vapor Deposition of Copper from (hfac)CuL (L=tmvs and 2-butyne) in the Presence of Water, Methanol and Dimethyl Ether*", Chem. Mater., 8, pp 1119–1127, 1996, disclose a method of adding water vapor to (hfac)Cu(tmvs). The deposition rate of the copper precursor is improved, but the resistivity of the deposited copper is poor.

SUMMARY OF THE INVENTION

A method of forming a copper thin film by chemical vapor deposition, includes introducing a wafer into a chemical vapor deposition chamber; humidifying helium gas with water to form a wet helium gas for use as the atmosphere in the chemical vapor deposition chamber; depositing a copper seed layer at a wet helium flow rate of between about 5.0 sccm and 20.0 sccm during a wafer temperature rise from ambient temperature to between about 150° C. to 230° C.; and depositing a copper thin film layer at a wet helium flow rate of between about 0.2 sccm to 1.0 sccm and at a temperature of between about 150° C. to 230° C.

An object of the invention is provide an improved copper thin film deposition through the introduction of water into the CVD process.

Another object of the invention is to provide a copper thin film having a low resistivity.

A further object of the invention is to provide a precursor to be used in CVD of copper thin films.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 1 is a schematic representation of the apparatus used in the method of the invention.

FIGS. 2*a* and 2*b* are SEM photos depicting the morphology of first step copper thin film deposition.

DETAILED DESCRIPTION OF THE PREFERRED EMBODIMENT

Figure 3:
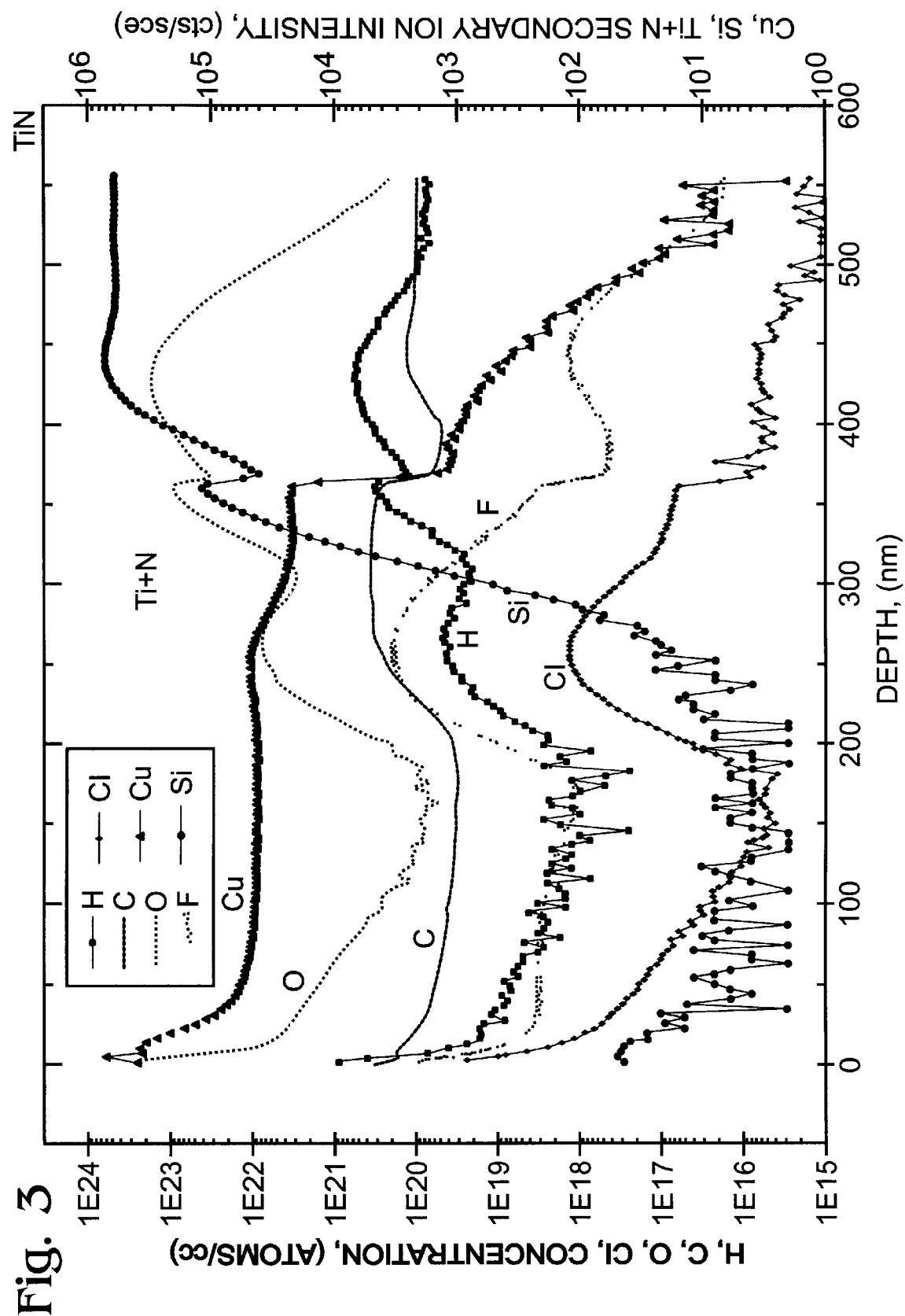
FIG. 3 depicts a SIMS analysis of (α-methylstyrene)Cu(I)(hfac).

Two major steps are involved in the formation of copper thin film via chemical vapor deposition process according to the method of the invention. The first step is the formation of a copper seed layer, and the second step is the growth of a copper thin film layer on the copper seed layer. The adhesive properties of the copper thin film are determined during the formation of copper seed layer. If the copper seed layer has good adhesive properties to the metal nitride substrates, such as TiN, TaN, WN, etc., the adhesive properties of the later deposited copper thin film will also be good. On the other hand, if the copper seed layer has poor adhesive properties, the copper thin film formed thereon will also exhibit poor adhesion to metal nitride substrates.

A well known copper precursor has a typical chemical formula of Cu(I)(hfac)L, where L=alkyne and alkene, and hfac=hexafluoroacetylaceton, and undergoes decomposition on the wafer surface at high temperature to form a copper metal layer and Cu(II)(hfac)$_2$ and L, where L is any suitable ligand, as shown in Eq. 1:

$$2Cu(I)(hfac)L \rightarrow 2Cu + Cu(II)(hfac)_2 + 2L \qquad (1)$$

The alkyne or alkene ligand in the precursor acts as a stabilizer for the stabilization of the copper organometallic compound, Cu(I)(hfac)L. This stabilizer ligand may be replaced or exchanged by a polar liquid, such as water, THF, etc. However, the result of the replacement will result in decomposition of the copper precursor in Cu(I)(hfac)L, because water and/or THF do not allow the precursor to be stabilized.

Another copper precursor, (α-methylstyrene)Cu(I)(hfac), is used in the method of the invention. This copper precursor has three advantages: The first of these is the effect of Cu(hfac)$_2$ on the stability of (α-methylstyrene)Cu(I)(hfac) in liquid phase and also in CVD processing. The second is good adhesion to both TiN and TaN coated substrates of copper thin films deposited using this copper precursor. And finally, experimental CVD copper thin films exhibited similar electrical properties to those deposited using CupraSelect, and other Cu(I)(hfac)L complexes. Finally, α-methylstyrene has a much lower cost than trimethylvinylsilane.

In precursor synthesis, all manipulations are carried out in a nitrogen-filled glove box, or by using standard Schlenk techniques. Dichloromethane and α-methylstyrene are purified by refluxing over calcium hydride. They are distilled before use. Copper monoxide and α-methylstyrene were obtained from commercial sources.

To synthesize (α-methylstyrene)Cu(I)(hfac), Cu$_2$O (69 grams, 0.48 mol) was placed in a 2000 mL three-neck flask. 800 mL of CH$_2$Cl$_2$ was then added. To this mixture, α-methylstyrene (113 grams, 0.96 mol) was added, and then the contents of the flask were stirred for about 10 minutes. Then, H(hfac) (200 grams, 0.96 mol) was added drop-wise in about three minutes. The color of the mixture gradually changed from red to green. The solution was stirred for another two minutes and then filtered through a 0.7 μm size filter paper to remove excess $Cu_2O$. The $CH_2Cl_2$ solvent was removed under dynamic vacuum. Some green crystals were formed during solvent stripping and these crystals were collected and used for subsequent X-ray crystallographic studies. After five hours, the solution was filtered again through a 0.2 μm size filter paper, from which 270 grams of final product was obtained. The density was measured at 1.40 grams/mL. To this product, 5 wt % (13.5 grams) of α-methylstyrene was added to enhance stability, which also changed the density to 1.36 grams/mL. The resulting green liquid solution was found to be stable for at least two months, and was used as precursor for CVD copper thin film deposition. The green color was confirmed to be due to $Cu(hfac)_2$, which indicates that the final green liquid precursor was a mixture of $Cu(hfac)_2$, (α-methylstyrene)Cu(I)(hfac), and excess α-methylstyrene.

Pure (α-methylstyrene)Cu(I)(hfac) was subsequently synthesized as a clear yellow liquid. In this synthesis, $Cu_2O$ (80 grams, 0.56 mol) was placed into a 2000 mL round bottom flask, and 500 mL $CH_2Cl_2$ was added. To this mixture, α-methylstyrene (68 grams, 0.58 mol) was introduced. The contents of the flask were cooled to 0° C. in an ice bath, and stirred for about 40 minutes. Again, H(hfac) (100 grams, 0.48 mol) was added drop-wise, however, care was taken to add the H(hfac) slowly (in about 15 minutes) while maintaining strong stirring of the flask contents. In this case, the color of the mixture gradually changed from red to diluted yellow. The green color did not appear. After completing the addition of the H(hfac), continuous and strong stirring was maintained for another five minutes, and then the material was filtered and transferred to another flask through a plastic capillary which had a filter paper attached on the head. As usual, solvent was removed under dynamic vacuum, and a final filtration of the product through a 0.2 μm size filter was carried out. This produced pure (α-methylstyrene)Cu(I)(hfac) (164.9 grams, yield: 88.2%) without significant admixture of $Cu(hfac)_2$. The density was measured to be 1.38 $g/cm^3$. However, pure (α-methylstyrene)Cu(I)(hfac) was found to be unstable even with the addition of additional α-methylstyrene. Indeed, it is quite difficult to use this pure form for CVD copper thin film deposition because of decomposition in the delivery system, particularly in the vaporizer and showerhead.

Two synthesis methods were investigated. The resulting green liquid obtained in the first case is a mixture of (α-methylstyrene)Cu(I)(hfac) and $Cu(hfac)_2$, which can be stabilized by the addition of extra α-methylstyrene and then used for CVD copper thin film deposition. It is likely that the environment of $Cu(hfac)_2$ in precursor solution is similar to that of the solid crystals observed by x-ray crystallography, with two molecules of (α-methylstyrene)Cu(I)(hfac) associated with one molecule of $Cu(hfac)_2$. Pure (α-methylstyrene)Cu(I)(hfac) liquid, obtained using the second synthesis method, cannot be used for CVD process because of decomposition in the delivery system. Clearly, $Cu(hfac)_2$ stabilizes (α-methylstyrene)Cu(I)(hfac) both in liquid phase and in the precursor delivery system. The stabilization mechanism may be related to the high vapor phase stability of $Cu(hfac)_2$ and its partial bonding with (α-methylstyrene)Cu(I)(hfac).

Copper thin films were deposited using (α-methylstyrene)Cu(I)(hfac) precursor by thermal CVD onto p-type 150 mm single crystal silicon substrates pre-coated with PVD of TiN to a thickness of about 500Å and CVD of $SiO_2$ to a thickness of about 1000 Å, or PVD of TaN to a thickness of about 500 Å and CVD of $SiO_2$ to a thickness of about 1000 Å. A controlled amount of water vapor was introduced during deposition using an independent helium carrier gas stream. A standard four-point probe was used for sheet resistance measurements and film thickness was measured gravimetrically or by SEM and/or profilometer.

During CVD, two steps of copper thin film deposition include the introduction of different amount of copper precursors. In the formation of the copper seed layer, a very small amount of copper precursor is used, and during this period, the wafer surface is heated to deposition temperature from room temperature. In the second step, the flow of the copper precursor is greatly increased, and the rapid growth of copper thin films begin.

In order to obtain the desired high-adhesion copper thin films, high adhesion of the copper seed layer must be achieved. A wet helium gas, having a high humidity, is introduced into the CVD reaction chamber. The preferred method of such introduction is by bubbling helium gas through a water-containing vessel, wherein the pressure in the bubbler is reduced below ambient to produce a large volume of water vapor, thereby producing wet helium.

In the preferred embodiment of the method of the invention, the chemical vapor deposition of copper thin films includes use of (α-methylstyrene)Cu(I)(hfac) precursor. Referring now to FIG. 1, an apparatus suitable for practicing the method of the invention is schematically depicted, generally at 10. Apparatus 10 includes a bubbler 12 having a quantity of distilled, de-ionized water 14 therein. A helium source 16 provide a helium flow into bubbler 12 and through water 14. A vacuum pump 18 reduced the pressure within bubbler 12 to below that of the ambient pressure. A CVD chamber 20 received the wet helium source 22. Copper precursor source 24 provides a gas flow into CVD chamber 20, which is evacuated by precursor outflow 26. It will be understood by those of ordinary skill in the art that wet helium source 22 and precursor inflow 24 may enter chamber 20 by a single point, and that the flow of the gases may be controlled by an appropriate valving arrangement, such as a mass flow controller. Chamber 20 contains a wafer 28, which is mounted on a holder 30. Holder 30 includes a heating mechanism to heat wafer 28.

Wafers, having a metal or metal nitride substrate, are introduced into a CVD chamber at ambient temperature. The chamber is evacuated and a wet helium atmosphere introduced. The chamber is sealed and the chamber pressure held at between about 0.1 torr. to 1.5 torr. For the first step of the method of the invention, a wet helium gas flow rate of between about 5.0 sccm to 20.0 sccm is maintained. The temperature of the wafers is raised from ambient temperature to between about 150° C. to 230° C. in about one minute. A very slow precursor flow rate, estimated to be between about 0.01 mL/min and 0.05 mL/min. is maintained during the first step. The vaporizer and showerhead temperatures are maintained in a range of between about 65° C. and 85° C. This results in the formation of a copper seed layer having a high adhesion to the substrate, which seed layer may be continuous or non-continuous, and having a thickness of between about 20 nm and 80 nm.

For the second step of the method of the invention, a wet helium gas flow rate of between about 0.2 sccm to 1.0 sccm is maintained, which results in a copper thin film having low resistivity. The temperature of the wafers is maintained at between about 150° C. to 230° C. for about one minute. A precursor flow rate of between about 0.1 mL/min and 0.5 mL/min. is maintained. As in the first step, the vaporizer and showerhead temperatures are maintained in a range of between about 65° C. and 85° C. This results in the formation of a copper thin film on the seed layer. The method of the invention is summarized in Table 1:

TABLE 1

| Step | Wet He Flow Rate (sccm) | Temperature ° C. | Time (minutes) | Precursor Flow Rate (mL/min) |
|---|---|---|---|---|
| Seed Layer | 5.0–20.0 | ambient → 150–230 | ~1 | 0.01 to 0.05 |
| Cu Thin Film | 0.2–1.0 | 150–230 | to provide film of a desired thickness | 0.1 to 0.5 |

Copper thin films have been deposited by thermal CVD onto TiN and TaN coated substrates using the green precursor liquid, which is a combination/mixture of (α-methylstyrene)Cu(I)(hfac), Cu(hfac)$_2$, and α-methylstyrene solution. Primary efforts were concentrated on studies of initial thin film deposition and collateral thin film adhesion to metal nitride coated substrates. First of all, we have confirmed that initial deposition of copper thin films has a critical role on the subsequent thin film growth and thin film properties. With the exception of the very first wafer, wherein the thin film was deposited after a long period of chamber pumping, the initial copper thin film deposition occurs during wafer-heating prior to introduction of precursor and bulk deposition. Indeed, the source for the initial copper thin film is residual precursor from previous thin film deposition that remains in the vaporizer or some portion of the precursor delivery line. The morphology of the initial stage, also referred to as the nucleation stage, is first island-like, independent particles, as shown in FIG. 2a, which then connect to each other to form column-like pillars, as shown in FIG. 2b, and finally to form a continuous thin film.

The introduction of a controlled amount of water vapor into the deposition chamber using a stream of helium carrier gas improves adhesion, and also greatly improves the film conductivity. Thus, there is a dual purpose for using water in copper thin film deposition. In experiments, the bubbler 12 is evacuated to a very low pressure, and the wet helium carrier gas flow rate is precisely controlled using a mass flow controller. Experimental results indicate that good adhesion of bulk copper thin films can only be achieved by proper treatment for film initial stage deposition. Thus, wet helium gas is introduced into the deposition chamber in two steps. The first step is during the nucleation stage of copper thin film, and the second, is during later copper thin film deposition. In relative terms, much more water is introduced into the chamber in the first step than in the second step.

To get good copper thin film adhesion, the wet helium carrier gas flow rate in the first stage is set at between about 5.0 sccm to 20 sccm, with a preferable flow rate in the lower portion of the range. In the second stage, to achieve low bulk resistivity, the flow rate is decreased to between about 0.2 sccm to 1.0 sccm, with the preferable flow rate at about 0.5 sccm. The first step is carried out during wafer-heating before deposition and the second step during actual thin film deposition. To initiate the precursor source for the first step deposition, one or two dummy wafers may be used. From this two-step water introduction process, high adhesion between copper thin films and both TiN and TaN substrates have been obtained using the copper precursor described herein. The deposition rate is extremely low during the initial stage using high water vapor treatment. However, good adhesion of copper on the first wafer and subsequent wafers has been achieved. One concern of a large amount of water vapor introduced into the initial stage of copper thin film deposition, is the effect on film properties due to interface contamination of carbon, oxygen, or fluorine impurities. To examine this further, film purity was analyzed by SIMS, as shown in FIG. 3. Carbon, oxygen and fluorine interface contamination levels have been determined as $2 \times 10^{19}$, $10^{20}$ and $10^{18}$ atoms/cc, respectively. These are comparable with results obtained using (tmvs)Cu(hfac) for copper thin film deposition.

Figure 4:
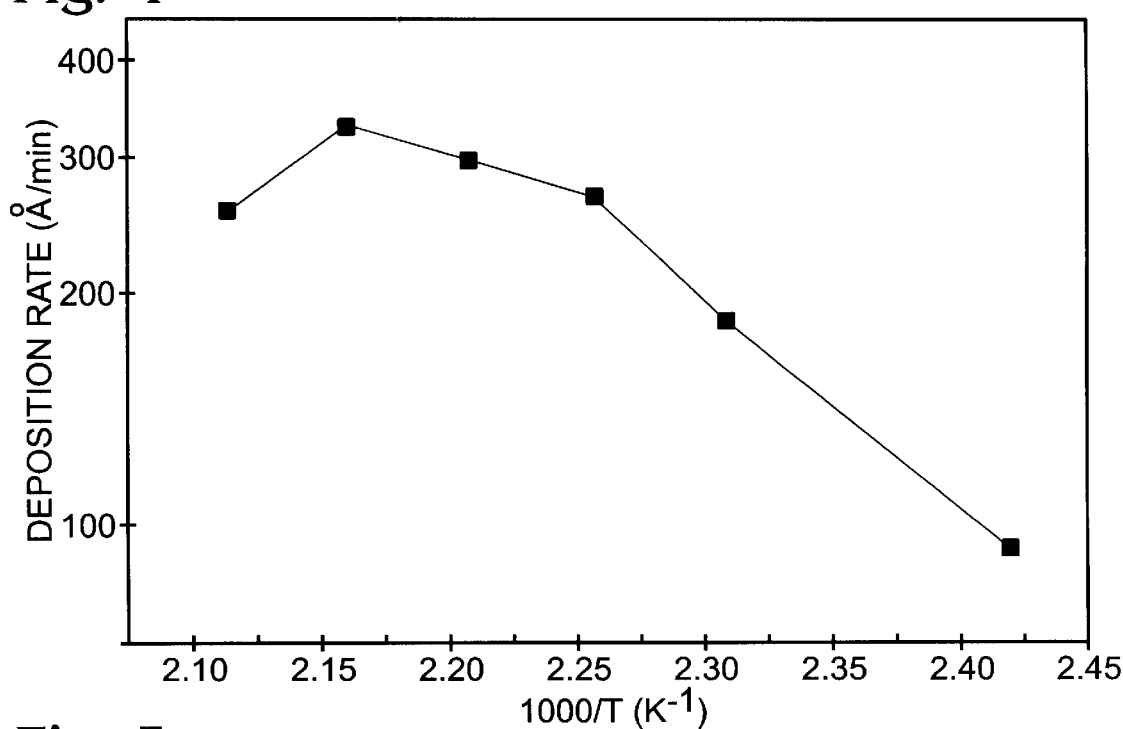
FIG. 4 depicts deposition rate vs. deposition temperature.
Figure 5:
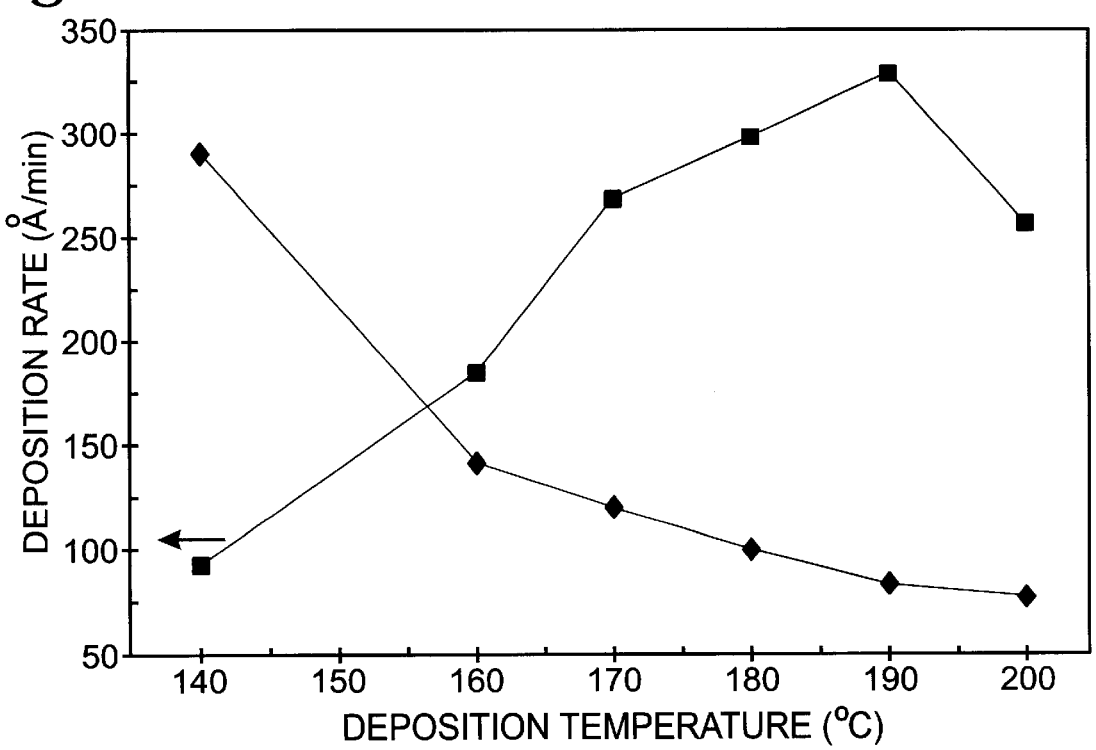
FIG. 5 depicts the relationship between resistivity, deposition rate and deposition temperature.

FIG. 4 is a plot of deposition rate versus deposition temperature, from which activation energy of 12.82 kcal/mol was calculated for deposition temperatures below 190° C. As shown in FIG. 5, the resistivity decreases with the increase of deposition temperature. The film thickness for resistivity measurement is about 2000 Å. For copper thin films deposited at 190–200° C., a measured resistivity of 1.92 μΩ·cm was obtained without any further heat treatment.

Figure 6:
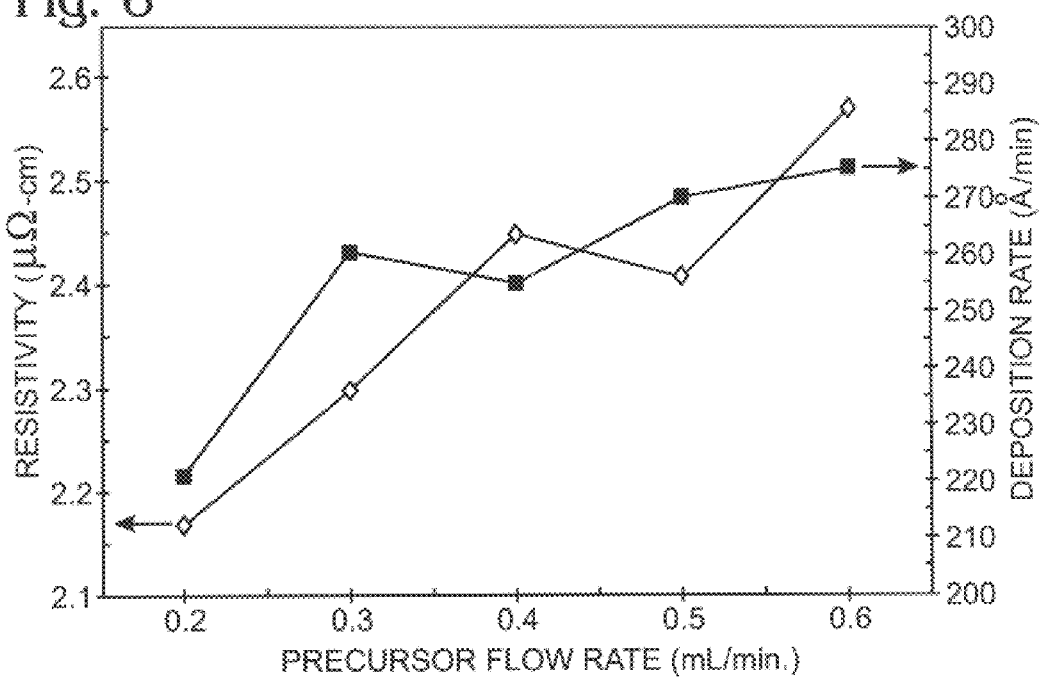
FIG. 6 depicts precursor flow rate vs. resistivity and deposition rate.
Figure 7:
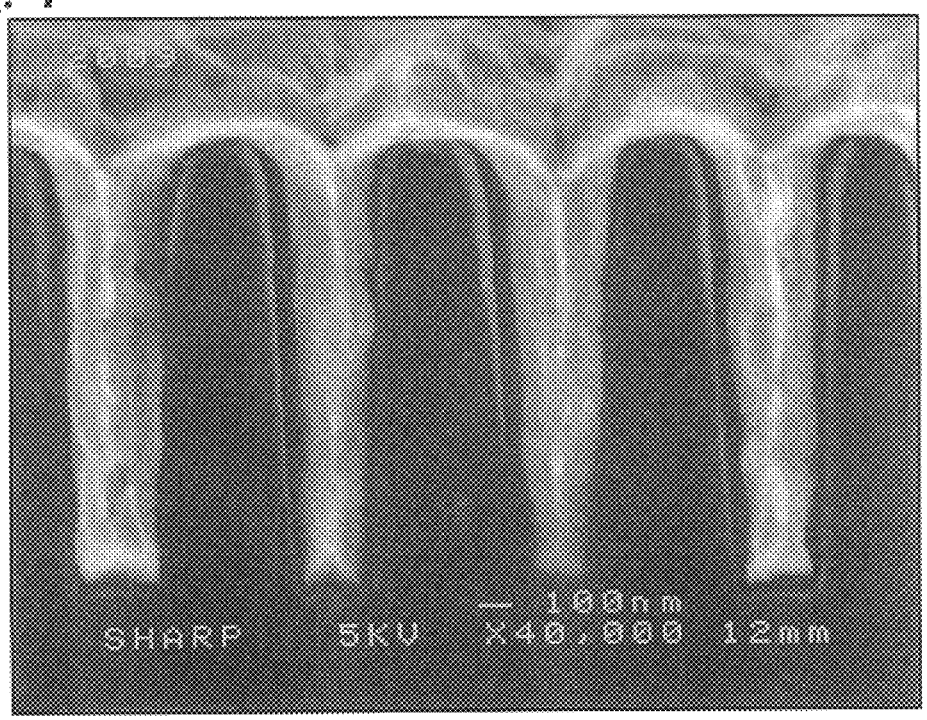
FIG. 7 is a SEM photo of filled trenches using the method of the invention.

The effect of precursor flow rate is shown in FIG. 6. The measured copper thin film thickness was about 1000 Å, and the deposition temperature was 180° C. Higher precursor flow rate results in higher resistivity and higher deposition rate. The deposition rate exhibits a small increase when the precursor flow rate is above 0.3 mL/min. This deposition rate is acceptable for the purpose of copper seed layer deposition. Trench filling using (hfac)Cu(I)(α-methylstyrene) has also been carried out, as shown in FIG. 7. The trenches are 0.3 μm at the bottom with a 4:1 height to width aspect ratio.

The adhesion properties of the copper thin films were compared for various CVD parameters. When the wet helium gas was not introduced into the reactor chamber during the first 60 seconds of wafer heating time, the deposited copper thin films had poor adhesion to metal nitride substrates. When the wet helium gas was introduced into the chamber during the wafer heating time, the copper thin films exhibited extremely good adhesion to metal nitride substrates.

Therefore, at high temperature, if a suitable amount of water vapor amount is introduced to the wafer surface, the water will replace the stabilizer ligand of L, and cause a more rapid decomposition of the copper precursor than would otherwise occur, which results in the formation of smaller copper seed crystals, an increase in deposition rate, and a decrease in the resistivity of the deposited thin film.

Thus, a method of improving the adhesive properties of copper thin films to metal nitride substrates has been disclosed. It will be appreciated that further variations and modifications thereof may be made within the scope of the invention as defined in the appended claims.

We claim:

1. A method of forming a copper thin film by chemical vapor deposition, comprising:

introducing a wafer into a chemical vapor deposition chamber;

humidifying helium gas with water to form a wet helium gas for use as the atmosphere in the chemical vapor deposition chamber;

depositing a copper seed layer at a wet helium flow rate of between about 5.0 sccm and 20.0 sccm during a wafer temperature rise from ambient temperature to between about 150° C. to 230° C. in about one minute; and depositing a copper thin film layer at a wet helium flow rate of between about 0.2 sccm to 1.0 sccm and at a temperature of between about 150° C. to 230° C.

2. The method of claim 1 wherein said depositing a copper seed layer includes providing a very slow copper precursor flow rate of between about 0.01 mL/min. to 0.05 mL/min.

3. The method of claim 1 wherein said depositing a copper thin film layer includes providing a copper precursor flow rate of between about 0.01 mL/min. to 0.5 mL/min.

4. The method of claim 1 wherein said depositing a copper seed layer and said depositing a copper thin film layer layer, include, in the chemical vapor deposition chamber, heating a vaporizer and a showerhead to a temperature of between about 65° C. to 85° C.

5. The method of claim 1 which includes maintaining the chemical vapor deposition chamber at a pressure of between about 0.1 torr. and 1.5 torr.

6. A method of forming a copper thin film by chemical vapor deposition, comprising:

introducing a wafer into a chemical vapor deposition chamber;

humidifying helium gas with water to form a wet helium gas for use as the atmosphere in the chemical vapor deposition chamber;

depositing a copper seed layer at a wet helium flow rate of between about 5.0 sccm and 20.0 sccm during a wafer temperature rise from ambient temperature to between about 150° C. to 230° C. in about one minute, and providing a very slow copper precursor flow rate of between about 0.01 mL/min. to 0.05 nL/min.; and depositing a copper thin film layer at a wet helium flow rate of between about 0.2 sccm to 1.0 sccm and at a temperature of between about 150° C. to 230° C., and providing a copper precursor flow rate of between about 0.1 mL/min. to 0.5 mL/min.

7. The method of claim 6 wherein said depositing a copper seed layer and said depositing a copper thin film layer layer, include, in the chemical vapor deposition chamber, heating a vaporizer and a showerhead to a temperature of between about 65° C. to 85° C.

8. The method of claim 6 which includes maintaining the chemical vapor deposition chamber at a pressure of between about 0.1 torr. and 1.5 torr.

9. A method of forming a copper thin film by chemical vapor deposition, comprising:

introducing a wafer into a chemical vapor deposition chamber;

humidifying helium gas with water to form a wet helium gas for use as the atmosphere in the chemical vapor deposition chamber;

depositing a copper seed layer from a copper precursor having the chemical formula Cu(I)(hfac)L, where L=a ligand, and wherein hfac=hexafluoroacetylacetone, at a wet helium flow rate of between about 5.0 sccm and 20.0 sccm during a wafer temperature rise from ambient temperature to between about 150° C. to 230° C. in about one minute, wherein water vapor in the wet helium atmosphere replaces the stabilizer ligand of L during copper deposition; and depositing a copper thin film layer at a wet helium flow rate of between about 0.2 sccm to 1.0 sccm and at a temperature of between about 150° C. to 230° C.

10. The method of claim 9 wherein said depositing a copper seed layer includes providing a copper precursor flow rate of between about 0.01 mL/min. to 0.05 mL/min.

11. The method of claim 9 wherein said depositing a copper thin film layer includes providing a copper precursor flow rate of between about 0.1 mL/min. to 0.5 mL/min.

12. The method of claim 9 wherein said depositing a copper seed layer and said depositing a copper thin film layer layer, include, in the chemical vapor deposition chamber, heating a vaporizer and a showerhead to a temperature of between about 65° C. to 85° C.

13. The method of claim 9 which includes maintaining the chemical vapor deposition chamber at a pressure of between about 0.1 torr. and 1.5 torr.

* * * * *